United States Patent [19]
Kuo et al.

[11] Patent Number: 5,751,174
[45] Date of Patent: May 12, 1998

[54] DOUBLE EDGE TRIGGERED FLIP-FLOP

[75] Inventors: Sy-Yen Kuo; Tzi-Dar Chiueh; Ke-Horng Chen, all of Taipei, Taiwan

[73] Assignee: National Science Council of Republic of China, Taipei, Taiwan

[21] Appl. No.: 691,679

[22] Filed: Aug. 2, 1996

[51] Int. Cl.$^6$ ................................................. H03K 3/356
[52] U.S. Cl. ........................... 327/199; 327/215; 327/219; 327/223
[58] Field of Search .................................... 327/199, 215, 327/217, 219, 223, 202

[56] References Cited

U.S. PATENT DOCUMENTS 5,179,295  1/1993  Mattison et al. ..................... 307/289
5,467,038  11/1995  Motley et al. ....................... 327/185

Primary Examiner—Timothy P. Callahan
Assistant Examiner—An T. Luu
Attorney, Agent, or Firm—Bacon & Thomas

[57] ABSTRACT

A double edge triggered flip-flop is made up of six switches and four inverters. The input data is supplied to one end each of first and second ones of the six switches, the other ends of the first and second switches being separately connected to the inputs of a first and second of the four inverters. The outputs of the first and second inverters are separately connected to the input of the third and fourth inverters via the third and fourth switches. The third inverter serves as a common feedback inverter with the output of the third inverter is connected through the fifth and sixth switches to respective ends of the first and second switches, and the output of the fourth inverter forms the output of the present invention. The first, third, and fifth switches thus form the up-loop for the double edge triggered flip-flop and the second, fourth, and sixth switches forming the down loop, with the two loops sharing the third and fourth inverters.

5 Claims, 6 Drawing Sheets

5,751,174

DOUBLE EDGE TRIGGERED FLIP-FLOP

BACKGROUND OF THE INVENTION

1. Field of the Invention

The present invention relates to a static D-type double edge triggered flip-flop which is suitable for low power application.

2. Description of the Prior Art

Currently, portable wireless communication devices are becoming popular throughout the world. Low power design is very important to support these devices, particularly with respect to the integrated circuit, in which excessive power consumption will make the chip over heat and cause errors or even permanent damage. The seriousness of this problem increases with the level of integration and thus we need to consider the power consumption of chips for every component in the device.

SUMMARY OF THE INVENTION

Regarding a CMOS gate, if its load is $C_L$, its dynamic power consumption will be $\frac{1}{2}\alpha C_L V_{dd}^2 f$, where $\alpha$ is the transition activity at the output point, $V_{dd}$ is supply voltage, and f is operating frequency. When the operating frequency decreases, the power consumption of the CMOS gate will decrease too. As the double edge triggered flip-flop (DET) uses half the clocking frequency of a single edge triggered flip-flop, if the system adopts a double edge triggered flip-flop, it will have less power consumption than adopting single edge triggered flip-flops. Especially, when the system has long clock lines, the double edge triggered flip-flop saves more power because of its use of a half clocking frequency.

References decribing research concerning double edge triggered flip-flops include: 1) R. Hossain, L. D. Wronski, and A. Albicki, "Low power design using double edge triggered flip-flops," IEEE Trans. on VLSI Systems, vol. 2, no. 2, pp. 261–265 June 1994. 2) S. H. Unger, "Double edge-triggered flip-flops," IEEE Trans, Comput., vol. C-30, no. 6 pp. 447–451, June 1992. 3) S. Lu and M. Ercegovac, "A Novel CMOS implementation of double edge triggered flip-flops," IEEE J. Solid-State Circ., vol. 25, pp. 1008–1010, 1990. 4) A. Gago, R. Escano, J. A. Hidalgo, "Reduced implementation of D-type DET flip-flops," IEEE J. Solid-State Circ., vol. 28, no. 3, pp. 400–402, March 1993), etc. Most of the above research is based on the use of four more transistors than a single edge triggered flip-flop so as to simplify the double edge triggered flip-flop. However, the present invention can provide even further simplification relative to the single edge triggered flip-flop by adding only two to four transistors. Simulation results prove that present invention save more power than the above double edge triggered flip-flops.

The reference by Hossain, L. D. Wronski, and A. Albicki, "Low power design using double edge triggered flip-flops," IEEE Trans. on VLSI Systems, vol. 2, no. 2, pp. 261–265, June 1994 points out that a double edge triggered flip-flop will consume less power than single edge triggered flip-flop only at high data rates. The advantage of the present invention is to decrease the point of high data rate. To decrease the frequency of this point can increase the applicability of a double edge triggered flip-flop to the low power devices.

FIG. 1 is a diagram of a conventional D-type double edge triggered flip-flop (DET1) circuit which shows one pair of parallel loops in the static double edge triggered flip-flop. When the clock pulse changes from low to high, the top loop holds data and the down loop samples data, but when the clock pulse changes from high to low, the top loop switches to sample data and then the down loop switches to hold the data.

According to the invention, however, one of two loops always samples the data and the other loop always holds data. Therefore, only a single feedback loop holds data and the re-design of the double edge triggered flip-flop can eliminate one feedback loop and decrease two transistors from the original design. The present invention only uses 14 transistors, which is less transistors than in any current double edge triggered flip-flop construction. To compare with the single edge triggered flip-flop shown in FIG. 2 (composed by 12 transistors), the present invention only has two more transistors.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

Figure 3:
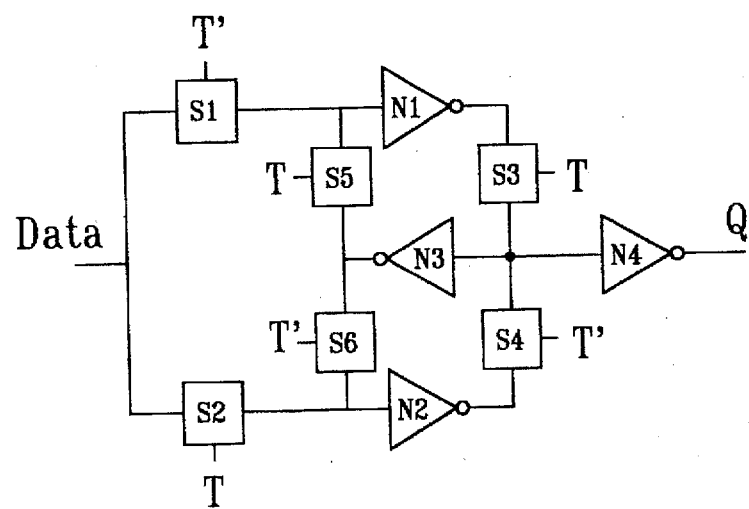
FIG. 3 is a circuit diagram of the present invention.

FIG. 3 is a circuit of the present invention. The present invention is composed of six switches and four inverters. The input data is supplied to one end each of two switches (S1, S2), and the other end of the two switches (S1, S2) is separately connected to the input of two inverters (N1, N2). The outputs of the two inverters (N1, N2) are separately connected to the inputs of another two inverters (N3, N4) via switches (S3, S4). The output of inverter N3 goes through two switches S5, S6 to connect to one end of the above mentioned two switches (S1, S2) separately, and the output of the present invention.

The switches S1, S3, S5 and the inverter N1 form the up-loop, and the switches S2, S4, S6 and the inverter N2 form the down loop. These two loops use same feedback inverter N3 and same output inverter N4. The switches can be NMOS, PMOS, or CMOS transistors, or any combination thereof.

Switches S2, S3, and S5 are in an ON state when the control clock pulse T=1, and the switches S1, S4, and S6 are in an ON state when the control clock pulse T'=1. T and T' are inverse clock pulses.

Figure 4:
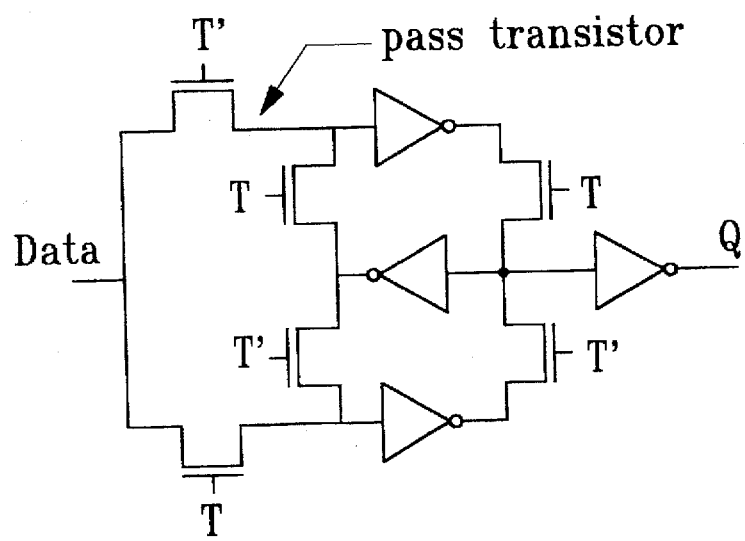
FIG. 4 is a first specific implementation.
Figure 5:
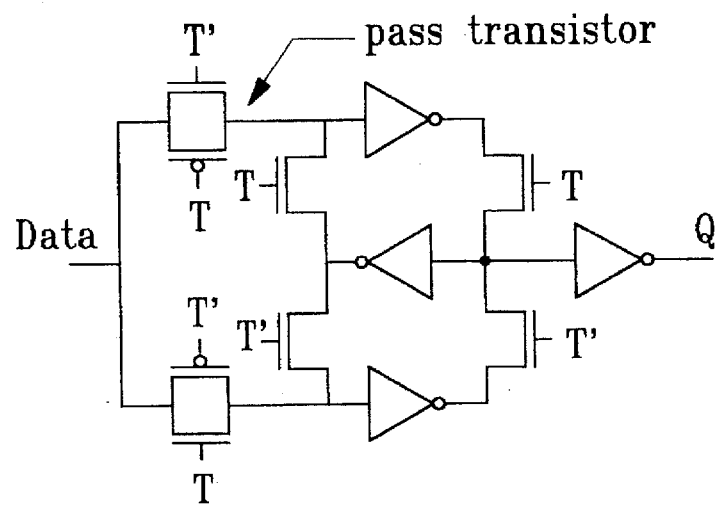
FIG. 5 shows a second specific implementation.

FIG. 4 shows a specific implementation of the present invention. If a pass transistor is used in the switch, the present invention will be influenced by charge sharing similar to other double edge triggered flip-flops. However, this problem will not influence the normal function of the circuit. If we change the two pass transistors of FIG. 4 to transmission gates, it can prevent some spikes and save power, in which case it will become another double edge triggered flip-flop which is composed by 16 transistors as shown in FIG. 5.

In the following simulations, we didn't consider the power consumption of the clock line in the device. If put into consideration, the DET will save even more power than the SET.

Figure 1:
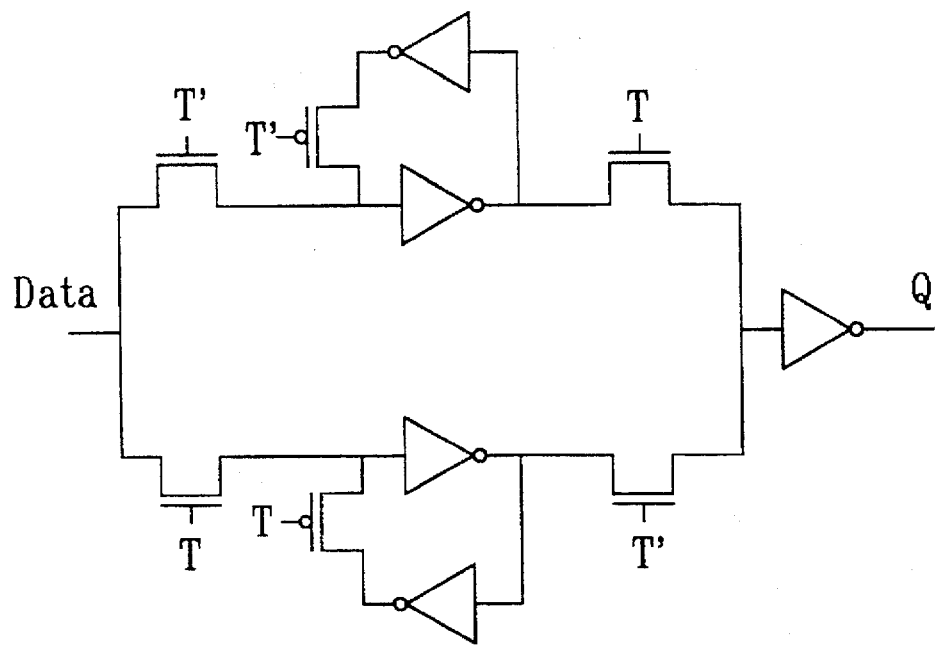
FIG. 1 is a circuit diagram of the conventional static D-type double edge triggered flip-flop (DET1)
Figure 2:
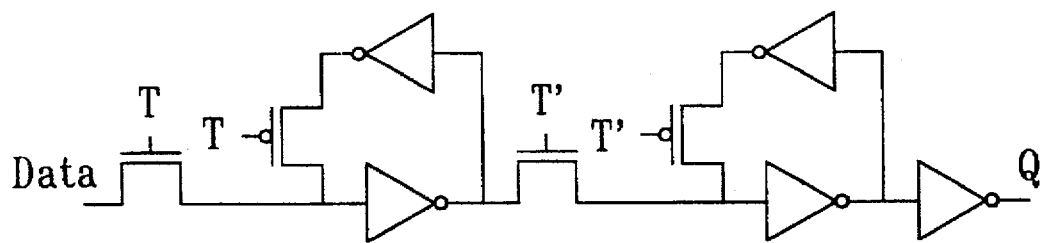
FIG. 2 is a circuit diagram of the conventional static D-type single edge triggered flip-flop (SET)
Figure 6:
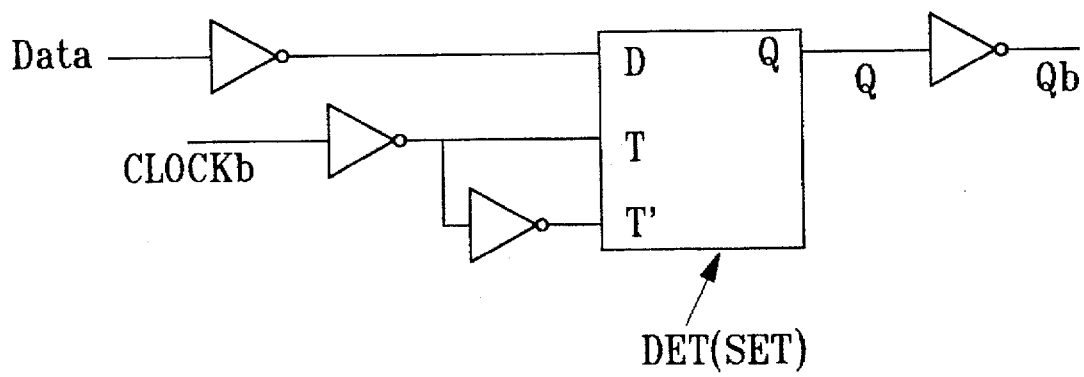
FIG. 6 is a simulation circuit set-up of the present invention.

FIG. 6 shows a simulation circuit set-up of the present invention. There are four circuits that will compare with the circuit of the present invention. DET1 is the circuit of FIG. 1; SET is the circuit of FIG. 2; DET3 is the circuit of FIG. 4; and DET3 is the circuit of FIG. 5. We adopt a 0.8 μm CMOS technique to measure the average power of these four D-type edge triggered flip-flops.

(i) The first part adopts two different data sequences to measure the average power of circuits of four different edge triggered flip-flops. The first data sequence is 101010, and the second data sequence is 110011001100. The result of measurement is shown in Table 1 and Table 2. The percentage in Table 1 and Table 2 corresponds to the percentage of power saving of DET1.

TABLE 1

Input Data Sequence is 101010 (the percentage is related to DET1)

| Data Rate | SET (*0.1 mW) | DET1 (*0.1 mW) | DET2 (*0.1 mW) | DET3 (*0.1 mW) |
|---|---|---|---|---|
| 333 (Mbits/s) | 5.40819 (−11.74%) | 4.84009 | 5.92132 (−22.34%) | 4.62855 (4.37%) |
| 167 (Mbits/s) | 2.83815 (−5.55%) | 2.68895 | 3.51118 (−30.58%) | 2.51696 (6.40%) |
| 83 (Mbits/s) | 1.55981 (−1.22%) | 1.54098 | 2.23555 (−45.07%) | 1.3924 (9.64%) |
| 10 (Mbits/s) | 0.5093 (21.50%) | 0.64875 | 1.26810 (−96.47%) | 0.57814 (10.88%) |

TABLE 2

Input Data Sequence is 110011001100 (the percentage is related to DET1)

| Data Rate | SET (*0.1 mW) | DET1 (0.1 mW) | DET2 (*0.1 mW) | DET3 (0.1 mW) |
|---|---|---|---|---|
| 333 (Mbits/s) | 3.83993 (−7.01%) | 3.58854 | 4.25656 (−18.62%) | 3.40522 (5.11%) |
| 167 (Mbits/s) | 1.99334 (3.12%) | 2.05761 | 2.66984 (−29.75%) | 1.86827 (10.13%) |
| 83 (Mbits/s) | 1.07163 (12.51%) | 1.22487 | 1.78390 (−45.64%) | 1.05368 (13.98%) |
| 10 (Mbits/s) | 0.34389 (40.40%) | 0.57708 | 1.13248 (−96.24%) | 0.49635 (13.99%) |

From Table 1 and Table 2, one finds that the DET3 circuit which is composed by 16 transistors always consumes less power than DET1 under varying data rates. For DET3, the saving power percentage is between 4% and 11% for input data sequence 101010, and the saving power is between 5% and 14% for input data sequence 110011001100.

Generally, the circuit of the DET2 double edge triggered flip-flop consumes more power than the circuit of the other edge triggered flip-flops (DET1, DET3) by influence of charge sharing. However, when the data rate increases, the difference in power consumption decreases, which means the charge of this double edge triggered flip-flop is more effective at high data rates.

As per the above mentioned reference, the double edge triggered flip-flop can save more power than the single edge triggered flip-flop in clock lines. Therefore, if one adds up the power saving of the clock line, the double edge triggered flip-flop device will save more power than that single edge triggered flip-flop.

Figure 7:
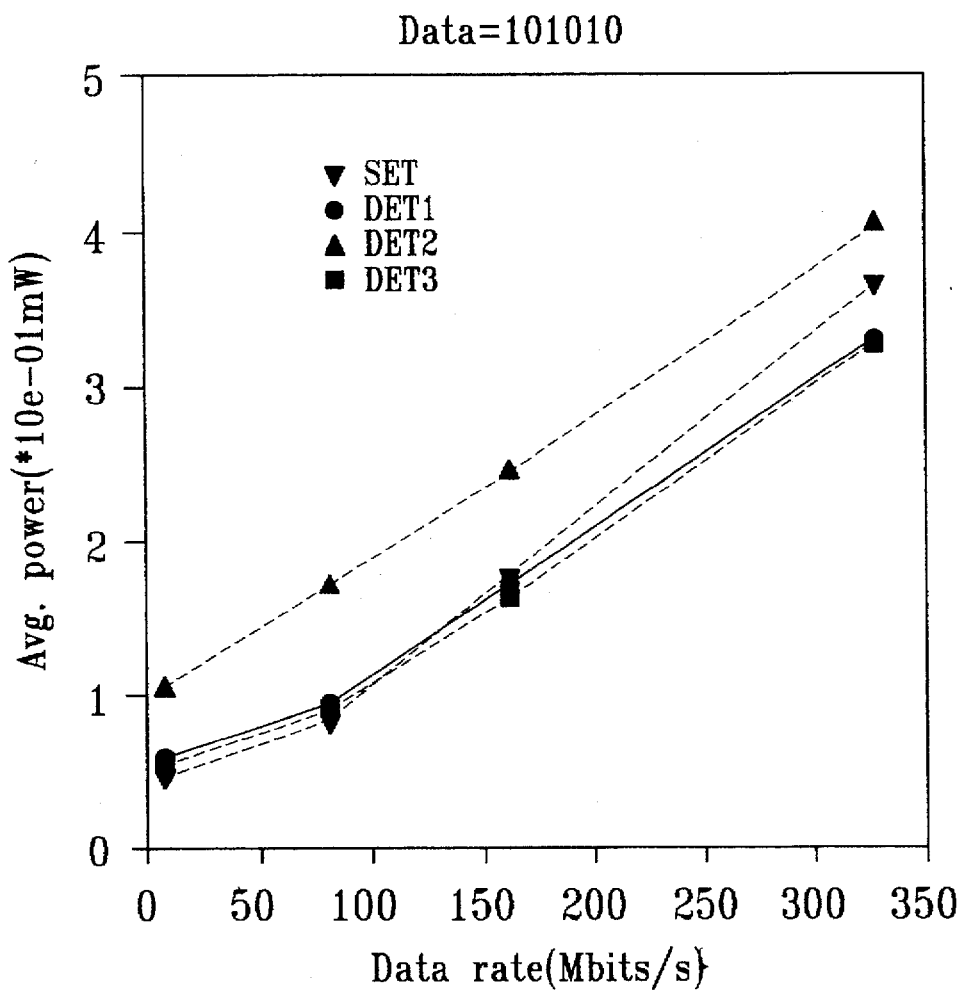
FIG. 7 is a simulation result curve of the present invention for data sequence 101010.
Figure 8:
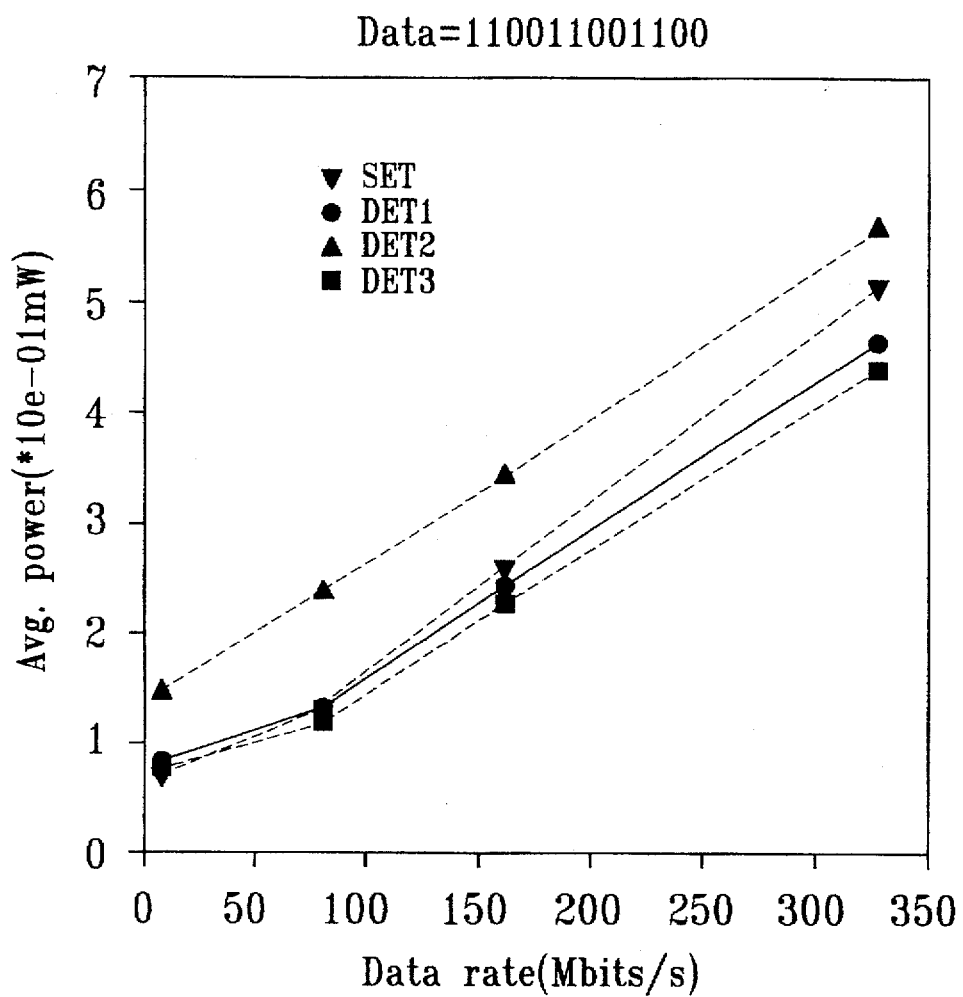
FIG. 8 is a simulation result curve of the present invention for data sequence 110011001100.

FIG. 7 and FIG. 8 are curves for Table 1 and Table 2. From these figures, one finds that for a low data rate, one single edge triggered flip-flop saves more power than one double edge triggered flip-flop. However, at a high data rate, the power consumption curve of the double edge triggered flip-flop starts to intersect the power consumption curve of the single edge triggered flip-flop, which means that one double edge triggered flip-flop begins to save more power than one single edge triggered flip-flop.

When the data sequence is 101010, the curve of the single edge triggered flip-flop intersects the curve of the double edge triggered flip-flop DET1 at 75 Mbits/s and intersects the curve of the double edge triggered flip-flop DET3 at 35 Mbits/s. When the data sequence is 110011001100, the curve of single edge triggered flip-flop SET intersects the curve of the double edge triggered flip-flop SET intersects the curve of the double edge triggered flip-flop DET1 at 200 Mbits/s and intersects the double edige triggered flip-flop DET3 at 70 Mbits/s. As regards double edge triggered flip-flop DET1, the actual intersection point depends on the input data sequence. For double edge triggered flip-flop DET3, the intersection point with single edge triggered flip-flop SET is smaller than DET1. Thus, the DET3 has broader applicative range than DET1.

As the average power consumption is related to the intersection point and the data sequence, so the following section will use a random data sequence to compare the average power consumption of these four edge triggered flip-flops.

Figure 9:
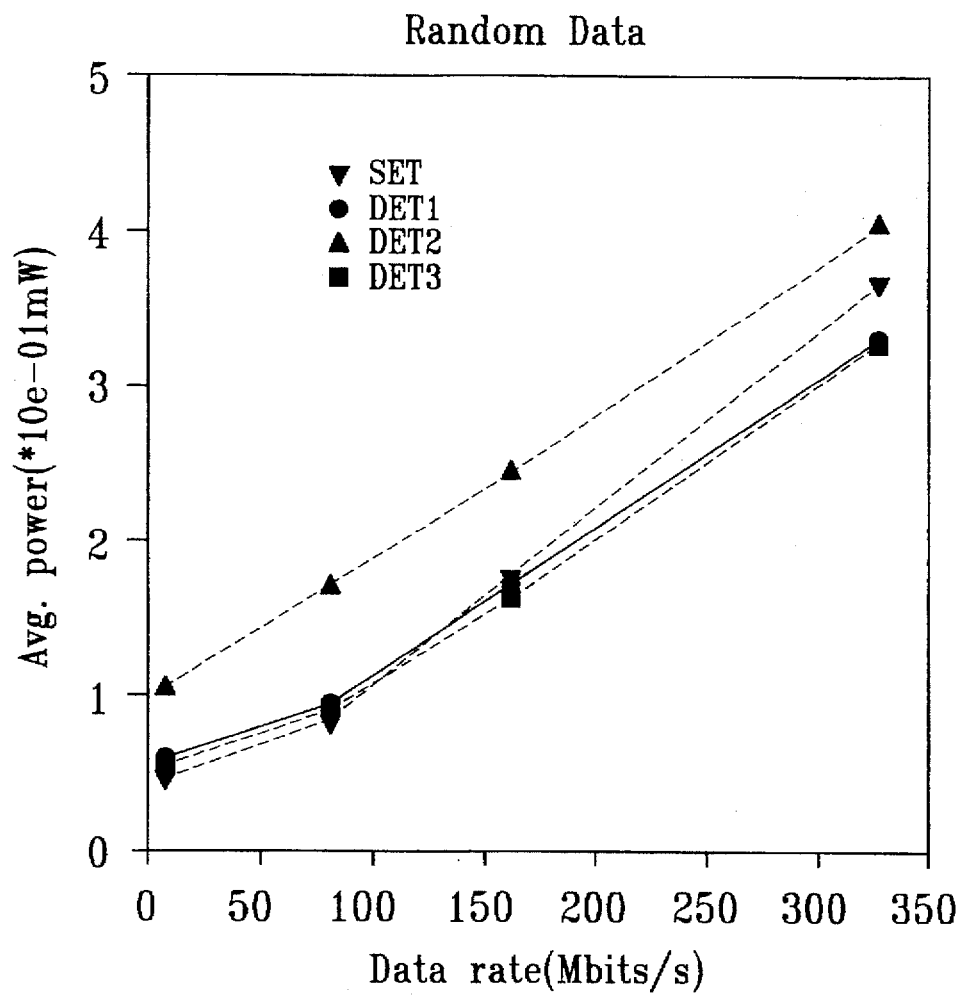
FIG. 9 is a simulation result curve of the present invention for a random data sequence.

(ii) In order to get a more realistic result, we adopt a random data sequence as input. Also, to prevent a random data sequence which is long and a waste of module time, we adopt five sets of shorter random data sequences. Although this is not a true random method, we can predict a small error rate by using this method. Table 3 and FIG. 9 shows the result of this module experiment. The double edge triggered flip-flop DET1 intersects the single edge triggered flip-flop SET at 140 Mbits/s and intersects the double edge triggered flip-flop DET3 at 110 Mbits/s. Obviously, DET3 has a lower intersection point.

TABLE 3

Input Data Sequence is random data (the percentage is related to DET1)

| Data Rate | SET (*0.1 mW) | DET1 (*0.1 mW) | DET2 (*0.1 mW) | DET3 (*0.1 mW) |
|---|---|---|---|---|
| 333 (Mbits/s) | 3.83993 (−7.01%) | 3.58854 | 4.25656 (−18.62) | 3.40522 (5.11%) |
| 167 (Mbits/s) | 1.99334 (3.12%) | 2.05761 | 2.66984 (−29.75%) | 1.86827 (10.13%) |
| 83 (Mbits/s) | 1.07163 (12.51%) | 1.22487 | 1.7839 (−45.64) | 1.05368 (13.98%) |
| 10 (Mbits/s) | 0.34389 (40.40%) | 0.57708 | 1.13248 (−96.24%) | 0.49635 (13.99%) |

Table 3 shows that for a high data rate, the double edge triggered flip-flop is more suitable for low power circuit application than a single edge triggered flip-flop. In other words, the present invention has two advantages:

1. Because it operates at half of the clock frequency, the clock line of the double edge triggered flip-flop consumes less power than the clock line of a single edge triggered flip-flop.

2. Relative to other double edge triggered flip-flops such as DET1, the power curve of the present invention example (DET3) intersects the power curve of the single edge triggered flip-flop at a lower data rate.

Many changes and modifications in the above described embodiment of the invention can, of course, be carried out without departing from the scope thereof. Accordingly, to promote the progress in science and the useful arts, the invention is disclosed in detail but is intended to be limited only by the scope of the appended claims.

What is claimed is:

1. A double edge triggered flip-flop, comprising:

six switches;

four inverters; and means for supplying data to one end each of first and second ones of the six switches, wherein:

other ends of the first and second switches are separately connected to the inputs of a first and second of the four inverters, outputs of the first and second inverters are connected to the input of the third and fourth inverters via the third and fourth switches, the third inverter is arranged to serve as a common feedback inverter by connecting the output of the third inverter through the fifth and sixth switches to said other ends of the first and second switches, and the output of the fourth inverter forms the output of the double edge triggered flip-flip, whereby the first, third, and fifth switches thus form an up-loop for the double edge triggered flip-flop and the second, fourth, and sixth switches form a down loop, with the up and down loops sharing the third and fourth inverters such that the second, third, and fifth switches are turned on by a first clock pulse and the first, fourth, and sixth switches are turned on by an inverse of the first clock pulse.

2. A double edge triggered flip-flop as claimed in claim 1, wherein the six switches are NMOS transistors.

3. A double edge triggered flip-flop as claimed in claim 1, wherein the six switches are PMOS transistors.

4. A double edge triggered flip-flop as claimed in claim 1, wherein the six switches are CMOS transistors.

5. A double edge triggered flip-flop as claimed in claim 1, wherein the six switches are include at least two types of transistors.

* * * * *